(12) United States Patent
Chandrachood et al.

(10) Patent No.: US 7,419,551 B2
(45) Date of Patent: *Sep. 2, 2008

(54) PLASMA REACTOR WITH APPARATUS FOR DYNAMICALLY ADJUSTING THE PLASMA SOURCE POWER APPLICATOR AND THE WORKPIECE RELATIVE TO ONE ANOTHER

(75) Inventors: Madhavi R. Chandrachood, Sunnyvale, CA (US); Richard Lewington, Hayward, CA (US); Darin Bivens, San Mateo, CA (US); Ajay Kumar, Sunnyvale, CA (US); Ibrahim M. Ibrahim, Santa Clara, CA (US); Michael N. Grimbergen, Redwood City, CA (US); Renee Koch, Brentwood, CA (US); Sheeba J. Panayil, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 118 days.

This patent is subject to a terminal disclaimer.

(21) Appl. No.: 11/416,547

(22) Filed: May 3, 2006

(65) Prior Publication Data
US 2007/0256784 A1 Nov. 8, 2007

(51) Int. Cl.
 C23C 16/00 (2006.01)
 H01L 21/306 (2006.01)
(52) U.S. Cl. .................. 118/729; 118/730; 118/723 R; 156/345.54; 156/345.55
(58) Field of Classification Search .............. 118/723 I, 118/723 IR, 723 AN, 728, 729, 730, 723 R; 156/345.48, 345.49, 345.51, 345.54, 345.55; 315/111.51
See application file for complete search history.

(56) References Cited

U.S. PATENT DOCUMENTS

| 4,512,841 | A | * | 4/1985 | Cunningham et al. ... 156/345.43 |
| 5,110,407 | A | * | 5/1992 | Ono et al. ................... 438/696 |
| 5,888,413 | A | * | 3/1999 | Okumura et al. .............. 216/68 |
| 5,975,013 | A | | 11/1999 | Holland et al. |
| 6,054,013 | A | | 4/2000 | Collins et al. |
| 6,229,264 | B1 | * | 5/2001 | Ni et al. ................. 315/111.51 |
| 6,414,648 | B1 | * | 7/2002 | Holland et al. .............. 343/895 |

(Continued)

Primary Examiner—Luz L. Alejandro
(74) Attorney, Agent, or Firm—Law Office of Robert M. Wallace

(57) ABSTRACT

A plasma reactor for processing a workpiece includes a process chamber comprising an enclosure including a ceiling and having a vertical axis of symmetry generally perpendicular to said ceiling, a workpiece support pedestal inside the chamber and generally facing the ceiling, process gas injection apparatus coupled to the chamber and a vacuum pump coupled to the chamber. The reactor further includes a plasma source power applicator overlying the ceiling and comprising a radially inner applicator portion and a radially outer applicator portion, and RF power apparatus coupled to said inner and outer applicator portions, and tilt apparatus capable of tilting either the workpiece support pedestal or the outer applicator portion about a radial axis perpendicular to said axis of symmetry and capable of rotating said workpiece support pedestal about said axis of symmetry. In a preferred embodiment, the reactor further includes apparatus for effecting axially symmetrical adjustments of plasma distribution, which may be either (or both) elevation apparatus for changing the location of said inner and outer portions relative to one another along said vertical axis of symmetry, or apparatus for apportioning the RF power levels applied to the inner and outer applicator portions.

16 Claims, 7 Drawing Sheets

U.S. PATENT DOCUMENTS

2003/0044529 A1 3/2003 Wu et al.
2007/0256787 A1 11/2007 Chandrachood et al.
2007/0257008 A1 11/2007 Chandrachood et al. ...... 216/67
2007/0257009 A1 11/2007 Chandrachood et al.

* cited by examiner

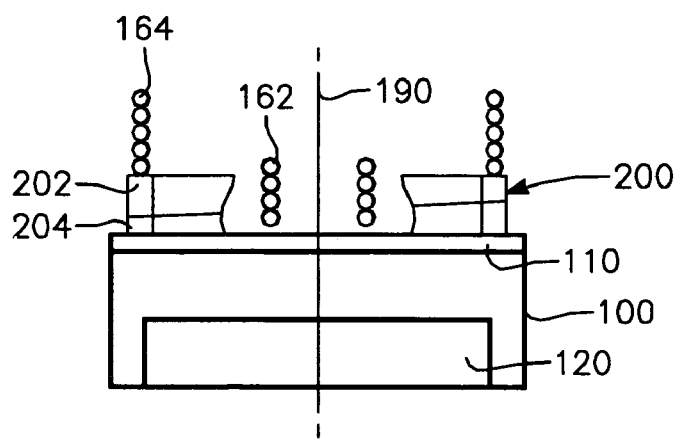 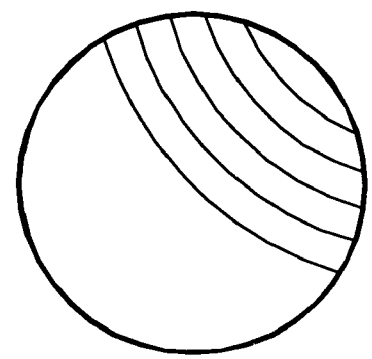
FIG. 3A              FIG. 4A
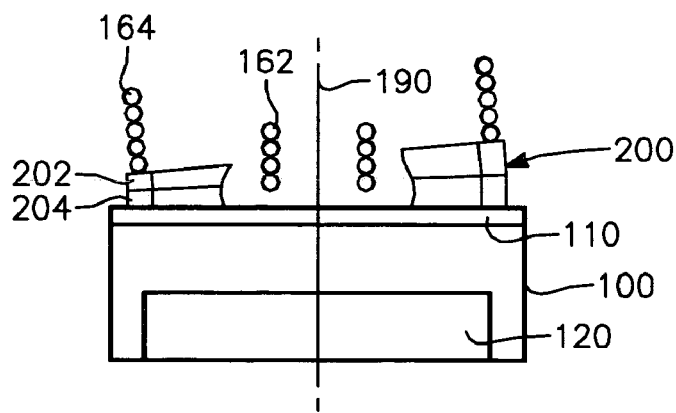 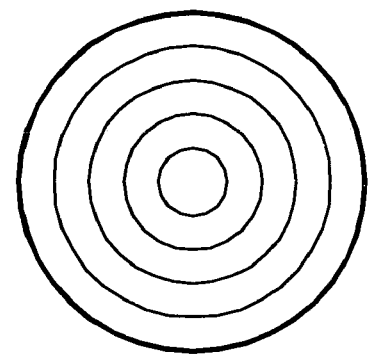
FIG. 3B              FIG. 4B
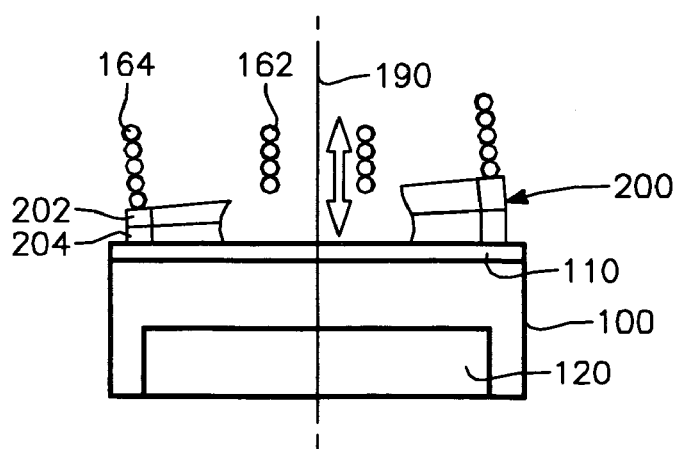 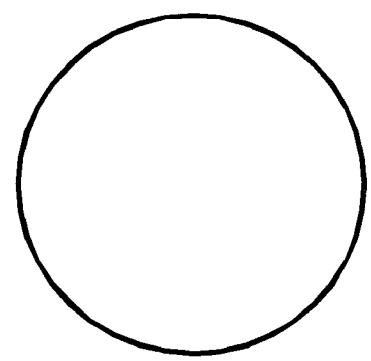
FIG. 3C              FIG. 4C 400 — Tilt the RF Source Power Applicator (or at Least Its Outer Portion or Coil) Relative to the Chamber or Relative to the Workpiece so as to Transform the Non-Uniform Distribution of a Plasma Process Parameter (e.g., Etch Rate) from a Non-Symmetrical Non-Uniform Distribution to an Axially Symmetrical Non-Uniform Distribution 402 — Vertically Translate the Inner RF Source Power Applicator (e.g., the Inner Coil) Relative to the Outer RF Source Power Applicator (e.g., the Outer Coil) so as to Transform the Axially Symmetrical Non-Uniform Distribution of the Process Parameter (e.g., Etch Rate) to a Uniform Distribution

FIG. 7

PLASMA REACTOR WITH APPARATUS FOR DYNAMICALLY ADJUSTING THE PLASMA SOURCE POWER APPLICATOR AND THE WORKPIECE RELATIVE TO ONE ANOTHER

BACKGROUND OF THE INVENTION

In semiconductor device fabrication involving plasma processing to form nanometer-scale feature sizes across a large workpiece, a fundamental problem has been plasma uniformity. For example, the workpiece may be a 300 mm semiconductor wafer or a rectangular quartz mask (e.g., 152.4 mm by 152.4 mm), so that maintaining a uniform etch rate relative to nanometer-sized features across the entire area of a 300 mm diameter wafer (for example) is extremely difficult. The difficulty arises at least in part from the complexity of the process. A plasma-enhanced etch process typically involves simultaneous competing processes of deposition and etching. These processes are affected by the process gas composition, the chamber pressure, the plasma source power level (which primarily determines plasma ion density and dissociation), the plasma bias power level (which primarily determines ion bombardment energy at the workpiece surface), wafer temperature and the process gas flow pattern across the surface of the workpiece. The distribution of plasma ion density, which affects process uniformity and etch rate distribution, is itself affected by RF characteristics of the reactor chamber, such as the distribution of conductive elements, the distribution of reactances (particularly capacitances to ground) throughout the chamber, and the uniformity of gas flow to the vacuum pump. The latter poses a particular challenge because typically the vacuum pump is located at one particular location at the bottom of the pumping annulus, this location not being symmetrical relative to the either the workpiece or the chamber. All these elements involve asymmetries relative to the workpiece and the cylindrically symmetrical chamber, so that such key parameters as plasma ion distribution and/or etch rate distribution tend to be highly asymmetrical.

The problem with such asymmetries is that conventional control features for adjusting the distribution of plasma etch rate (or deposition rate) across the surface of the workpiece are capable of making adjustments or corrections that are symmetrical relative to the cylindrical chamber or the workpiece or the workpiece support. (Examples of such conventional features include independently driven radially inner and outer source-power driven coils, independently supplied radially inner and outer gas injection orifice arrays in the ceiling, and the like.) Such features are, typically, incapable of completely correcting for non-uniform distribution of plasma ion density or correcting for a non-uniform distribution of etch rate across the workpiece (for example). The reason is that in practical application, such non-uniformities are asymmetrical (non-symmetrical) relative to the workpiece or to the reactor chamber.

There is, therefore, a need to enable conventional control features for adjusting distribution of plasma process parameters (e.g., distribution across the workpiece of either etch rate, or etch microloading, or plasma ion density, or the like) to correct the type of asymmetrical or non-symmetrical non-uniformities that are encountered in actual plasma process environments.

SUMMARY OF THE INVENTION

A plasma reactor for processing a workpiece includes a process chamber comprising an enclosure including a ceiling and having a vertical axis of symmetry generally perpendicular to said ceiling, a workpiece support pedestal inside the chamber and generally facing the ceiling, process gas injection apparatus coupled to the chamber and a vacuum pump coupled to the chamber. The reactor further includes a plasma source power applicator overlying the ceiling and comprising a radially inner applicator portion and a radially outer applicator portion, and RF power apparatus coupled to said inner and outer applicator portions, and tilt apparatus capable of tilting either the workpiece support pedestal or the outer applicator portion about a radial axis perpendicular to said axis of symmetry and capable of rotating said workpiece support pedestal about said axis of symmetry. In a preferred embodiment, the reactor further includes apparatus for effecting axially symmetrical adjustments of plasma distribution, which may be either (or both) elevation apparatus for changing the location of said inner and outer portions relative to one another along said vertical axis of symmetry, or apparatus for apportioning the RF power levels applied to the inner and outer applicator portions.

BRIEF DESCRIPTION OF THE DRAWINGS

FIGS. 3A, 3B and 3C depict successive steps in the operation of the embodiment of FIG. 1.

FIGS. 4A, 4B and 4C depict the etch rate distribution across the surface of a workpiece obtained in the respective steps of FIGS. 3A, 3B and 3C.

FIG. 7 is a block flow diagram depicting a first method of the invention.

DETAILED DESCRIPTION OF THE INVENTION

The present invention is based upon the inventors' discovery that spatial distribution across the workpiece surface of a plasma process parameter (such as etch rate) may be transformed from an asymmetrical distribution (relative to the workpiece or to the chamber) to a more symmetrical distribution. Following such a transformation, the distribution (e.g., etch rate distribution) readily may be corrected to a uniform (or nearly uniform) distribution by employing adjustment features that operate symmetrically relative to the workpiece or relative to the chamber. In a preferred embodiment, the spatial distribution of etch rate (for example) across the workpiece is transformed from an asymmetrical distribution to a symmetrical one by tilting an overhead plasma source power applicator relative to the workpiece at such an angle that the etch rate distribution becomes symmetrical with respect to the cylindrical symmetry of the chamber or of the workpiece. For example, the etch rate, which was initially distributed in a non-symmetrical fashion, may be transformed to a center-high or center-low etch rate distribution across the workpiece. The resulting center-high or center-low etch rate distribution is then rendered perfectly uniform (or nearly uniform) by adjusting an inner portion of the overhead source power applicator relative to an outer portion of the overhead source power applicator. In a preferred embodiment, the source power applicator is an inductively coupled source power applicator consisting of (at least) a radially inner symmetrically wound conductor coil and a radially outer symmetrically wound conductor coil concentric with the inner coil. In one implementation, the adjustment of the inner coil relative to outer coil is performed by adjusting the different heights of the inner and outer coils relative to the workpiece.

Figure 1:
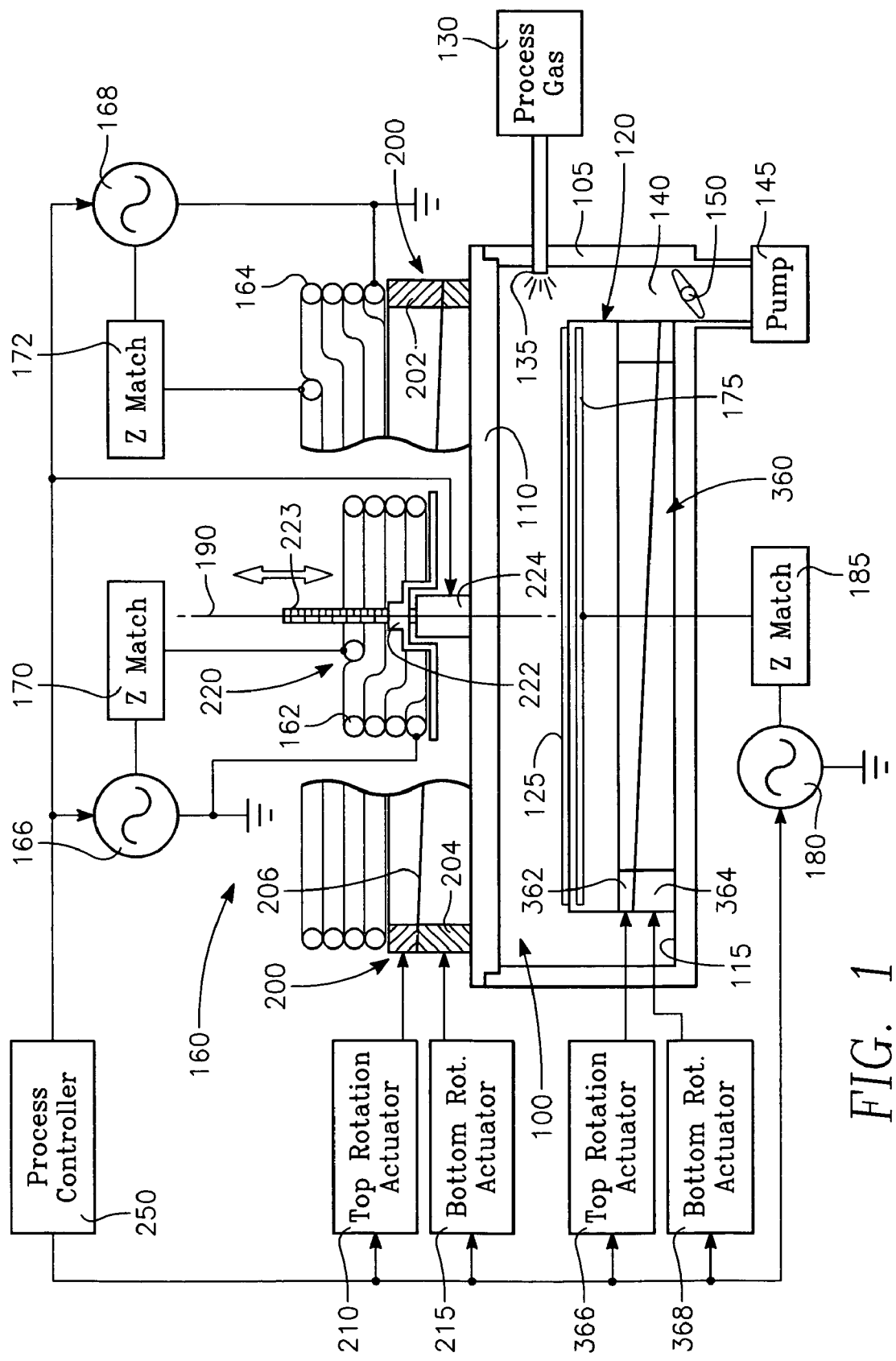
FIG. 1 depicts a reactor of a first preferred embodiment.

Referring to FIG. 1, a plasma reactor for processing a workpiece consists of a vacuum chamber 100 defined by a cylindrical side wall 105, a ceiling 110 and a floor 115. A workpiece support pedestal 120 on the floor 115 can hold a workpiece 125 that is either a semiconductor wafer or a quartz mask (for example). A process gas supply 130 furnishes a process gas at a desired flow rate into the chamber 100 through gas injection devices 135 which may be provided either in the side wall 105 as shown or in the ceiling 110. A pumping annulus 140 is defined between the workpiece support pedestal 120 and the side wall 105, and gas is evacuated from the chamber 100 through the pumping annulus 140 by a vacuum pump 145 under the control of a throttle valve 150. Plasma RF source power is coupled to the gases inside the chamber 100 by an RF plasma source power applicator 160 overlying the ceiling 110. In the preferred embodiment illustrated in FIG. 1, the source power applicator 160 consists of an inner RF coil or helical conductor winding 162 and an outer RF coil or helical conductor winding 164, driven by respective RF source power generators 166, 168 through respective impedance matches 170, 172. RF plasma bias power is coupled to the plasma by an electrode or conductive grid 175 inside the workpiece support pedestal 120 with bias power applied by an RF bias power generator 180 through an impedance match 185.

In order to adjust the distribution of plasma process non-uniformities across the surface of the workpiece 125, the outer coil 164 can be rotated (tilted) about any selected radial axis (i.e., an axis extending through and perpendicular to the chamber's cylindrical or vertical axis of symmetry 190). As one advantage of this feature, we have discovered that such a rotation (or "tilt") of the outer coil 164, if performed about an optimum radial axis and through an optimum angle, will transform a non-symmetrical non-uniform spatial distribution of a plasma process parameter (e.g., etch rate) to a symmetrical non-uniform distribution (i.e., symmetrical about the vertical or cylindrical axis of symmetry 190). The "optimum" radial axis and the "optimum" angle for this tilt rotation depends upon the individual characteristics of the particular reactor chamber, among other things, and are determined empirically prior to processing of a production workpiece, e.g., by trial and error testing.

Once the etch rate distribution is rendered symmetrical in this manner, its non-uniformities are readily corrected by adjusting the effect of the inner coil 162 relative to the outer coil 164. In a preferred embodiment, this adjustment can be made by changing the height above the ceiling of one of the coils 162, 164 relative to the other one. For this purpose, the inner coil 162 is translatable along the cylindrical axis of symmetry 190 relative to the outer coil 164 (and relative to the workpiece 125 and the entire chamber 100). If for example the etch rate distribution has been transformed from the typical non-symmetrical distribution to a symmetrical center-high distribution, then the non-uniformity is decreased (or eliminated) by translating the inner coil 162 vertically upward (away from the ceiling 110) to decrease plasma ion density over the center of the workpiece 125. Conversely, if for example the etch rate distribution has been transformed from the typical non-symmetrical distribution to a symmetrical center-low distribution, then this non-uniformity is decreased (or eliminated) by translating the inner coil 162 vertically downward (toward the ceiling 110) to increase plasma ion density over the center of the workpiece 125.

In an alternative embodiment, adjustment of the effect of the inner coil 162 relative to the outer coil can be made by adjusting the relative RF power levels applied to the different coils 162, 164. This can be in addition to or in lieu of vertical translation of the inner coil 162.

Figure 2A:
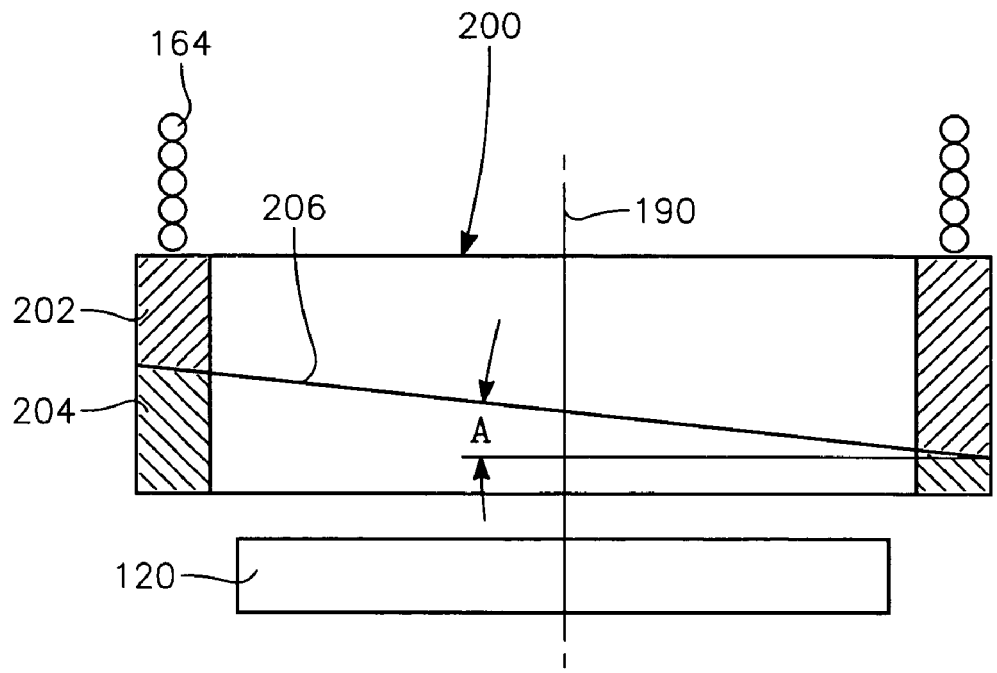
FIGS. 2A and 2B depict the operation of a tilt adjustment mechanism in the embodiment of FIG. 1.
Figure 2B:
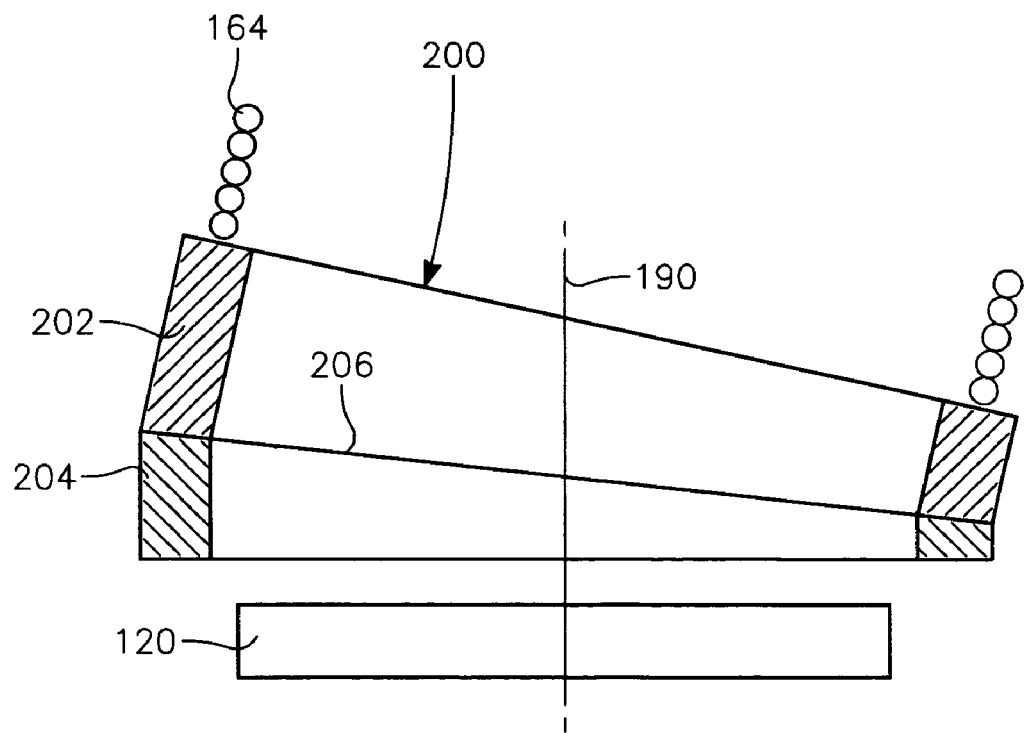

In the preferred embodiment, the tilt rotation of the outer coil 164 is performed with very fine control over extremely small rotation angles by a pair of eccentric rings 200, namely a top ring 202 and a bottom ring 204, best shown in FIGS. 2A and 2B. The outer coil 164 is supported by the top ring 202 and (preferably) rotates with the top ring 202. The upper and lower rings 202, 204 may be thought of as having been formed from a single annular ring which has been sliced in a plane 206 that is slanted at some angle "A" relative to the horizontal. As one of the two rings 202, 204 is rotated relative to the other about the cylindrical axis 190, the top surface of the top ring 202 tilts from the initial level orientation of FIG. 2A to the maximum rotation of FIG. 2B. For this purpose, the two rings 202, 204 are rotated independently of one another about the cylindrical axis 190 by respective top and bottom rotation actuators 210, 215. Either ring 202, 204 may be rotated in either direction (clockwise, counter-clockwise) about the axis 190 while the other ring is held still. Or, the two rings may be rotated simultaneously in opposite rotational directions for the fastest change in tilt angle. Also, in order to adjust the orientation of the tilt direction, the two rings 202, 204 may be rotated simultaneously in unison by the actuators 210, 215 either before or after a desired tilt angle is established. Thus, a typical sequence may be to establish a desired tilt angle by rotating the rings 202, 204 in opposite rotational directions until the desired tilt angle is reached, and then establishing the azimuthal direction of the tilt angle (e.g., "north", "south", "east" or "west" or any direction therebetween) by rotating the rings 202, 204 simultaneously in unison—or non-simultaneously—in the same rotational direction until the tilt direction is oriented as desired.

While in the preferred embodiment of FIG. 1 only the outer coil 164 is coupled to the top ring 202, in an alternative embodiment both the inner and outer coils 162, 164 are coupled to the top ring 202 so as to be tilted by the tilt actuators 210, 215.

The axial (vertical) translation (up or down) of the inner coil 162 is performed by a mechanical actuator, such as the screw-drive actuator 220 that is depicted in FIG. 1. The screw drive actuator 220 may be formed of non-conducting material and may consist of a threaded female rider 222 coupled to the inner coil 162 and a rotatable threaded screw 223 threadably engaged with the rider 222. The screw 223 is rotated clockwise and/or counter-clockwise by a vertical translation motor 224. Alternatively, the actuator 220 may be mounted on support structure overlying the coil 162 (not shown).

In an alternative (but not preferred) embodiment, the top ring 202 supports both the inner and outer coils 162, 164, so that the inner and outer coils 162, 164 tilt simultaneously together.

FIGS. 3A-3C and 4A-4C depict a basic process of the invention. Initially, the outer coil 164 is essentially level relative to the plane of the ceiling 110 and of the workpiece support 120, as depicted in FIG. 3A. The etch rate distribution tends to have a non-symmetrical pattern of non-uniformity, as depicted in FIG. 4A. The outer coil 164 is then tilted (FIG. 3B) about a particular radial axis by a particular angle that is sufficiently optimum to transform the non-symmetrical pattern of etch rate non-uniformities of FIG. 4A to the symmetrical distribution of non-uniformities of FIG. 4B. Such an axially symmetrical distribution (FIG. 4B) reflects an etch rate distribution that is either center-high or center-low (for example). This non-uniformity is reduced or eliminated to produce the perfectly uniform distribution of FIG. 4C by translating the inner coil 162 either up or down along the vertical axis 190, as indicated in FIG. 3C. Preferably, the inner coil 162 is not tilted with the outer coil 164. However, if both coils 162, 164 are tilted together, then the up/down translation of the inner coil 162 may be along a trajectory that is at a slight angle to the cylindrical axis 190.

In order to enable a versatile selection of all modes or combinations of all possible rotations of the top and bottom rings 162, 164 (i.e, for tilting and/or rotation about the cylindrical axis of the outer coil 164) and the vertical translation of the inner coil 162, a process controller 250 independently controls each of the rotation actuators 210, 215 and the translation actuator 220, as well as the RF generators 166, 168, 180.

Figure 5:
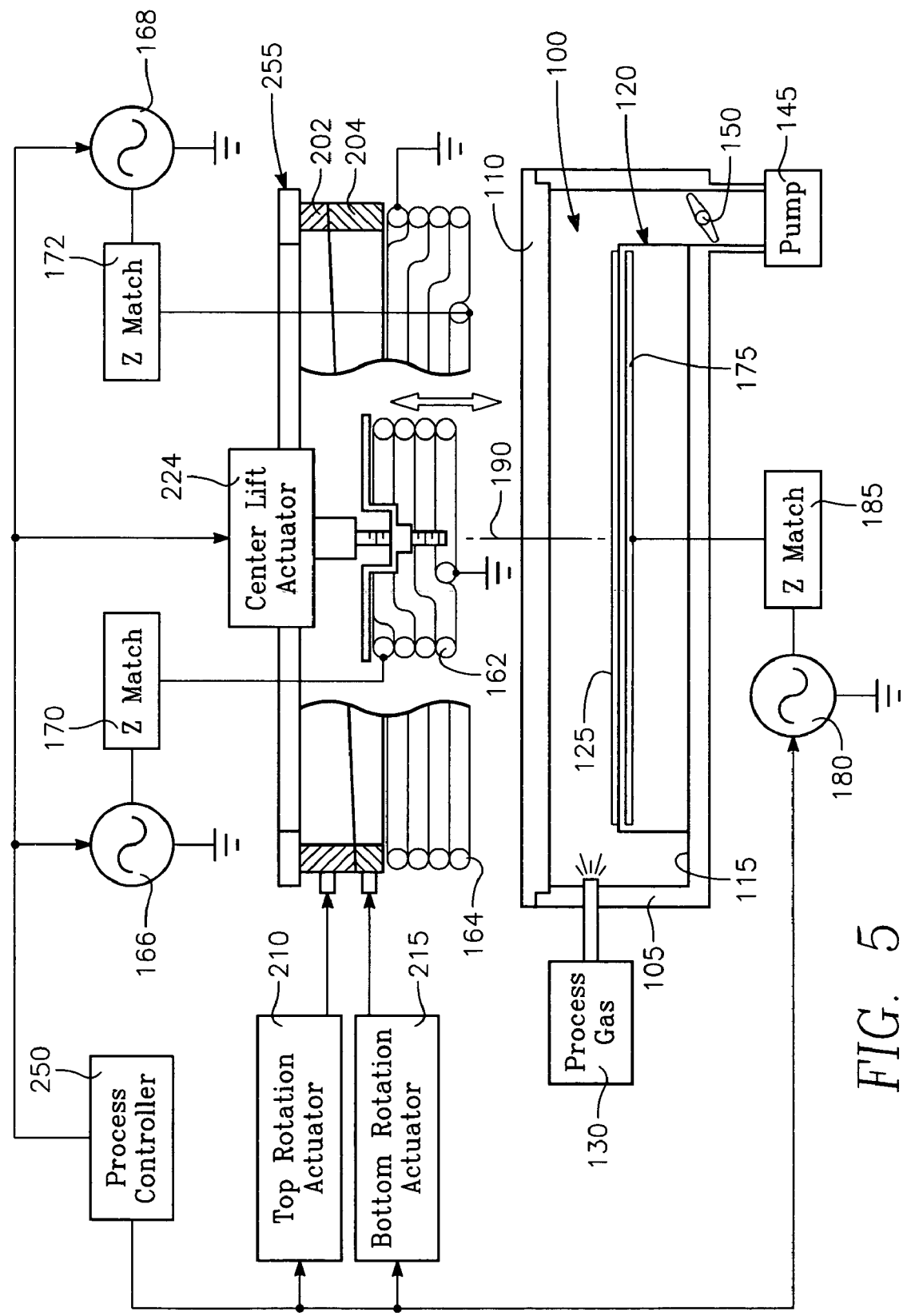
FIG. 5 depicts a reactor of a second preferred embodiment.

FIG. 5 depicts another alternative embodiment in which the outer coil 164 is suspended from the bottom of a support 255 coupled to the top ring 202 (rather than resting on the top ring 202 as in FIG. 1).

Figure 6:
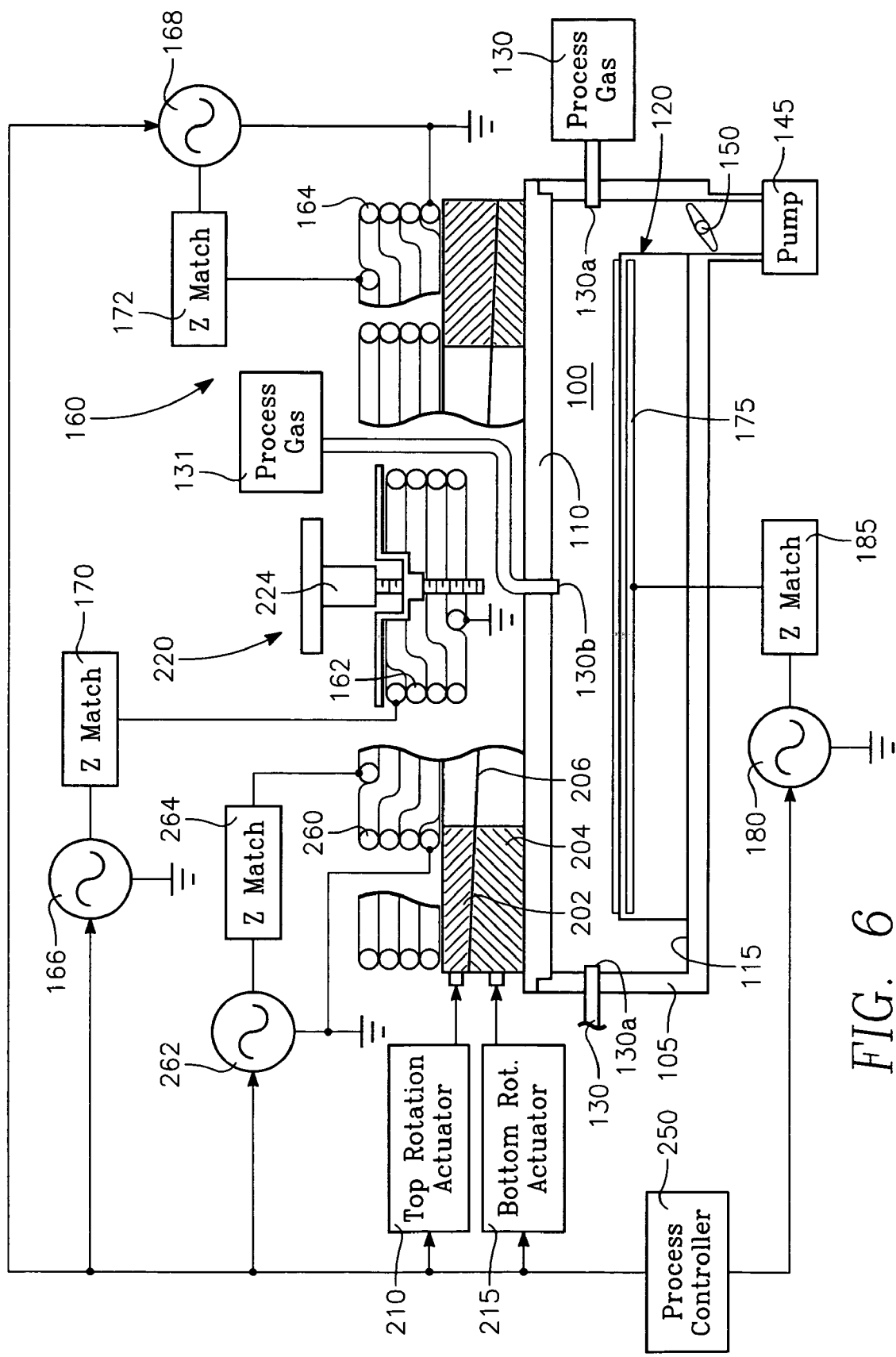
FIG. 6 depicts a reactor in accordance with an alternative embodiment.

FIG. 6 depicts another embodiment in which an intermediate coil 260 is introduced that lies between the inner and outer coils 162, 164, the intermediate coil being independently driven by an RF source power generator 262 through an impedance match 264. This embodiment may be employed in carrying out certain steps in a process of the invention in which each of the three coils 162, 164, 260 are driven with different RF phases (and possible the same RF frequency) to set up different maxima and minima in the RF power density distribution in the plasma generation region. This in turn is reflected in different patterns in etch rate distribution across s the surface of the workpiece 125. For example, the intermediate coil 260 may be driven 180 degrees out of phase from the inner and outer coils 162, 164.

Returning now to FIG. 1, while the preferred embodiments have been described with reference to apparatus and methods in which the outer coil 164 (at least) is rotated ("tilted") about a radial axis relative to the workpiece 125 and relative to the entire chamber 100, the converse operation could be performed to achieve similar results. Specifically, the workpiece 125 and workpiece support 120 could be tilted relative to the source power applicator 160 (and relative to the entire chamber 100) rather than (or in addition to) tilting the outer coil 164. For this purpose, a pair of concentric eccentric rings 360 (identical to the rings 162, 164 of FIG. 1), consisting of a top ring 362 and a bottom ring 364, are provided under and supporting the wafer support pedestal 120, so that the pedestal 120 can be tilted in the manner previously described with reference to the outer coil 164. Respective top and bottom actuators 366, 368 separately control rotation of the top and bottom rings 362, 364 about the cylindrical axis 190.

FIG. 7 is a block flow diagram depicting a first method of the invention. The first step (block 400), is to tilt the RF source power applicator 160 (or at least its outer portion or coil 164) relative to the chamber 100 or relative to the workpiece 125 so as to transform the non-uniform distribution of a plasma process parameter (e.g., etch rate) from a non-symmetrical non-uniform distribution (FIG. 4A) to an axially symmetrical non-uniform distribution (FIG. 4B). The second step (block 402) is to vertically translate the inner RF source power applicator (e.g., the inner coil 162) relative to the outer RF source power applicator (e.g., the outer coil 164) or relative to the ceiling 110 or workpiece 125, so as to transform the axially symmetrical non-uniform distribution of the process parameter (e.g., etch rate) (FIG. 4B) to a uniform distribution (FIG. 4C).

Figure 8:
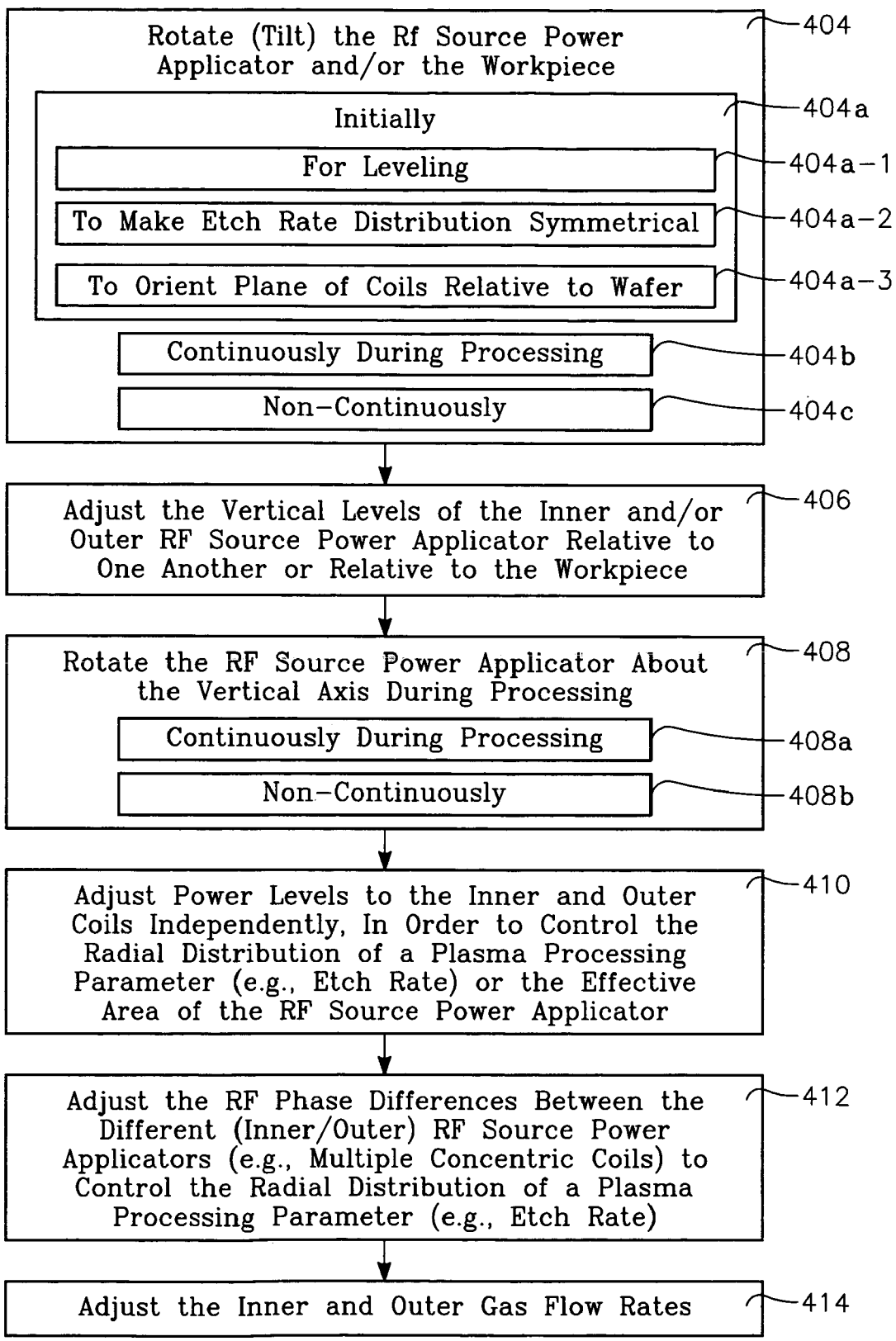
FIG. 8 is a block flow diagram depicting a second method of the invention.

FIG. 8 is a block flow diagram depicting another method of the invention that can subsume a number of different versions. The first step (block 404) is to rotate (tilt) the RF source power applicator 160 (or at least its outer coil 164) about a radial axis. In one version, this step is performed initially, i.e., prior to processing a production workpiece (block 404a). This step may be performed to level the source power applicator 160 (or outer coil 164) relative to a datum plane of the chamber 100 (block 404a-1). Or this step may be performed, as discussed previously in this specification, to make the etch rate distribution symmetrical (or at least nearly so) about the cylindrical axis 190 (block 404a-2). Or, this step may be performed to orient the plane of coil 164 relative to a plane of the workpiece 125 (block 404a-3). In another version, this step may be performed continuously during processing (block 404b). Alternatively, this step may be performed non-continuously or sporadically (block 404c).

In an alternative embodiment, the purpose of the step of block 404 is to tilt the plane of the source power applicator 160 (or at least its outer coil 164) relative to the plane of the workpiece 125, in which case either the coil 164 is tilted (using the rotation actuators 210, 215 of FIG. 1) or the workpiece support 120 is tilted (using the rotation actuators 366, 368). Or, it is possible to simultaneously tilt both the outer coil 164 and the workpiece support 120 until the desired relative orientation of the plane of one relative to the plane of the other one is achieved. As described above, the optimum orientation is one in which the distribution across the workpiece 125 of a plasma parameter such as etch rate is at least nearly symmetrical relative to the vertical axis of symmetry 190. This enables a symmetrical adjustment in plasma distribution to render the plasma process parameter distribution at least nearly uniform. Such a symmetrical adjustment may be a change in the relative heights of the inner and outer coils 162, 164, or a change in the relative RF power levels applied to the two coils, for example, or a change in respective process gas flow rates to the inner and outer portions of the process region overlying the workpiece 125. Such adjustments are carried out in some of the steps that are described below.

A next step is to adjust the vertical levels of the inner and/or outer RF source power applicators 162, 164 relative to one another or relative to the workpiece 125 (block 406). This step may be carried out for the purpose of transforming a cylindrically symmetrical non-uniform etch rate distribution across the workpiece 125 to a uniform distribution (or nearly uniform), as discussed above in this specification.

A next step is to rotate the RF source power applicator 160 (or at least its outer coil or portion 164) about the vertical axis during processing (block 408). As mentioned previously in this specification, such a step may be carried out by rotating the two eccentric rings 202, 204 simultaneously in unison. This step may be carried out continuously during processing (block 408a). Alternatively, this step may be carried out non-continuously or sporadically (block 408b), depending upon the desired effects during processing. Such a step may average out non-uniform effects of the source power applicator 160 across the surface of the workpiece 125 over a number of rotations during a given plasma process step. The rotation of the source power applicator 160 (or at least its outer portion 164) may be carried out before, during or after the tilting operation. The difference is that tilting requires relative rotational motion about the axis of symmetry 190 of the top and bottom rings 202, 204, whereas pure rotational motion about the axis of symmetry by the outer applicator portion 164 requires rotation in unison of the two rings 202, 204 with no relative motion between the two rings 202, 204. These two modes of motion may be performed simultaneously by combining the two types of relative ring motions. Although the outer applicator portion 164 may already be tilted so that its axis of symmetry does not coincide with the vertical axis 190, its rotational motion (when the rings 202, 204 rotate in unison) is nevertheless defined in this specification as occurring about the vertical axis 190.

A next step (block 410) may be to adjust the respective levels of RF power delivered to the inner and outer coils 162, 164 independently, in order to control the radial distribution of a plasma processing parameter (e.g., etch rate) or the effective area of the RF source power applicator 160. As one possible example, this step may be carried out to correct a symmetrical non-uniform etch rate distribution across the workpiece surface. As such, this step may be supplementary to (or in lieu of) the vertical translation of the inner coil 162 referred to above.

Another step (block 412) may be to adjust the RF phase differences between the different (inner/outer) source power applicator portions (e.g., multiple concentric coils 162, 164, 260 of FIG. 6) to control the radial distribution of a plasma processing parameter (e.g., etch rate). Different RF power distributions may be achieved with different phase relationships between the multiple coils, and some may be optimum for certain desired processing effects in particular instances.

In a further step that is optional (block 414 of FIG. 8), the process gas flow rates from process gas supplies 130, 131 to inner and outer gas inlets 130a, 131a (shown in FIG. 6) may be adjusted relative to one another to adjust plasma ion density radial distribution. The adjustments of block 406 (adjusting the relative axial locations of the inner and outer coils 162, 164), block 410 (adjusting the relative RF power levels applied to the inner and outer coils 162, 164) and block 414 (adjusting the relative gas flow rates to the inner and outer gas inlets 131a, 130a) are all symmetrical relative to the vertical axis 190 (FIG. 1) and may be used to render the etch rate distribution (for example) uniform, provided that the etch rate distribution has been transformed to a symmetrical one by the tilting step of block 404.

While the invention has been described in detail by specific reference to preferred embodiments, it is understood that variations and modifications thereof may be made without departing from the true spirit and scope of the invention.

What is claimed is:

1. A plasma reactor for processing a workpiece, comprising:
   a process chamber comprising an enclosure including a ceiling and having a vertical axis of symmetry generally perpendicular to said ceiling, a workpiece support pedestal inside the chamber and generally facing the ceiling, process gas injection apparatus coupled to the chamber and a vacuum pump coupled to the chamber;
   a plasma source power applicator overlying the ceiling and comprising a radially inner applicator portion and a radially outer applicator portion, and RF power apparatus coupled to said inner and outer applicator portions; and
   a tilt apparatus supporting said workpiece support pedestal and capable of tilting said workpiece support pedestal about a radial axis perpendicular to said axis of symmetry and capable of rotating said workpiece support pedestal about said axis of symmetry, wherein said tilt apparatus comprises:
      a ring divided into a pair of rings separated from one another along a sloping plane and comprising a top ring and a bottom ring; and
      a ring rotation actuator coupled to rotate at least one of said top and bottom rings.

2. The reactor of claim 1 further comprising:
   a elevation apparatus for changing the location of said inner and outer portions relative to one another along said vertical axis of symmetry.

3. The reactor of claim 2 wherein said elevation apparatus comprises a lift actuator for raising and lowering said inner applicator portion along said vertical axis of symmetry.

4. The reactor of claim 1 wherein said ring rotation actuator comprises a first ring rotation actuator for rotating said top ring about said axis of symmetry and a second ring rotation actuator for rotating said bottom ring about said axis of symmetry independently of the rotation of said top ring.

5. The reactor of claim 4 wherein said workpiece support is symmetrical relative to said axis of symmetry and defines a tiltable workpiece support plane transverse to said axis of symmetry.

6. The reactor of claim 4 further comprising:
   a lift actuator for raising and lowering said inner applicator portion along said vertical axis of symmetry; and
   a control processor governing: (a) said lift actuator, (b) said first and second ring rotation actuators and (c) said RF power apparatus.

7. The reactor of claim 6 wherein said control processor is programmable to tilt said workpiece support pedestal about a selected radial axis and to rotate said workpiece support pedestal to orient the direction of tilt.

8. The reactor of claim 7 wherein said control processor is programmable to raise or lower said inner applicator portion to a selected level.

9. The reactor of claim 7 wherein said RF power apparatus comprises independently controllable RF power outputs coupled to respective ones of said inner and outer applicator portions, and wherein control processor is programmable to change the relative amounts of RF power applied to the inner and outer applicator portions.

10. The reactor of claim 7 wherein said control processor is programmable to change the vertical elevation of said inner applicator portion by a desired amount.

11. The reactor of claim 7 wherein said source power applicator further comprises an intermediate applicator portion between said inner and outer applicator portions, said RF power apparatus further comprising a further independent RF power output coupled to said intermediate power applicator portion.

12. The reactor of claim 11 wherein said control processor is programmable to individually adjust the phase of RF voltage or current delivered to different ones of said inner, intermediate and outer applicator portions.

13. The reactor of claim 12 wherein said control processor is programmable to individually adjust the magnitude of RF power delivered to different ones of said inner, intermediate and outer applicator portions.

14. The reactor of claim 1 wherein said source power applicator is an inductively coupled source power applicator, said inner and outer applicator portions comprising inner and outer conductors wound in respective inner and outer coils about said axis of symmetry.

15. The reactor of claim 1 wherein said workpiece support pedestal is supported on said top ring.

16. The reactor of claim 1 wherein said RF power apparatus comprises independently adjustable RF power outputs coupled to respective ones of said inner and outer applicator portions.

* * * * *